(12) United States Patent
Coolbaugh et al.

(10) Patent No.: US 7,511,940 B2
(45) Date of Patent: Mar. 31, 2009

(54) FORMATION OF METAL-INSULATOR-METAL CAPACITOR SIMULTANEOUSLY WITH ALUMINUM METAL WIRING LEVEL USING A HARDMASK

(75) Inventors: Douglas D. Coolbaugh, Essex Junction, VT (US); Ebenezer E. Eshun, Essex Junction, VT (US); Natalie B. Feilchenfeld, Jericho, VT (US); Michael L. Gautsch, Richmond, VT (US); Zhong-Xiang He, Essex Junction, VT (US); Matthew D. Moon, Jeffersonville, VT (US); Vidhya Ramachandran, Ossining, NY (US); Barbara Waterhouse, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/838,939

(22) Filed: Aug. 15, 2007

(65) Prior Publication Data
US 2008/0019077 A1  Jan. 24, 2008

Related U.S. Application Data

(63) Continuation of application No. 10/709,907, filed on Jun. 4, 2004, now Pat. No. 7,301,752.

(51) Int. Cl.
*H01G 4/38* (2006.01)
(52) U.S. Cl. ............... 361/328; 361/306.1; 361/306.2; 361/303; 361/330; 361/761
(58) Field of Classification Search ............... 361/328, 361/330, 306.1, 306.2, 302–305; 257/532, 257/535
See application file for complete search history.

(56) References Cited

U.S. PATENT DOCUMENTS

| | | | |
|---|---|---|---|
| 5,736,448 A | 4/1998 | Saia et al. | |
| 5,827,766 A | 10/1998 | Lou | |
| 5,857,896 A | 1/1999 | Stollberg | |
| 5,998,264 A * | 12/1999 | Wu | 438/260 |
| 6,074,946 A | 6/2000 | Ouellet et al. | |
| 6,150,707 A | 11/2000 | Cook et al. | |
| 6,271,084 B1 * | 8/2001 | Tu et al. | 438/253 |
| 6,319,767 B1 | 11/2001 | Cha et al. | |
| 6,461,914 B1 | 10/2002 | Roberts et al. | |
| 6,528,366 B1 * | 3/2003 | Tu et al. | 438/253 |
| 6,583,491 B1 * | 6/2003 | Huang et al. | 257/532 |
| 6,593,185 B1 | 7/2003 | Tsai et al. | |
| 6,597,032 B1 | 7/2003 | Lee | |
| 6,597,583 B1 * | 7/2003 | Sasaki | 361/761 |
| 6,603,165 B2 | 8/2003 | Yamauchi et al. | |
| 6,720,232 B1 | 4/2004 | Tu et al. | |

(Continued)

*Primary Examiner*—Nguyen T Ha
(74) *Attorney, Agent, or Firm*—Gibb I.P. Law Firm, LLC; Anthony Canale

(57) ABSTRACT

Disclosed is a method of fabricating a metal-insulator-metal (MIM) capacitor. In this method, a dielectric layer is formed above a lower conductor layer and an upper conductor layer is formed above the dielectric layer. The invention then forms an etch stop layer above the upper conductor layer and the dielectric layer, and forms a hardmask (silicon oxide hardmask, a silicon nitride hardmask, etc.) over the etch stop layer. Next, a photoresist is patterned above the hardmask, which allows the hardmask, the etch stop layer, the dielectric layer, and the lower conductor layer to be etched through the photoresist.

13 Claims, 7 Drawing Sheets

U.S. PATENT DOCUMENTS 6,972,265 B1 12/2005 Schwarz
7,038,266 B2 5/2006 Wang
7,154,162 B2 12/2006 Ahn et al.

* cited by examiner

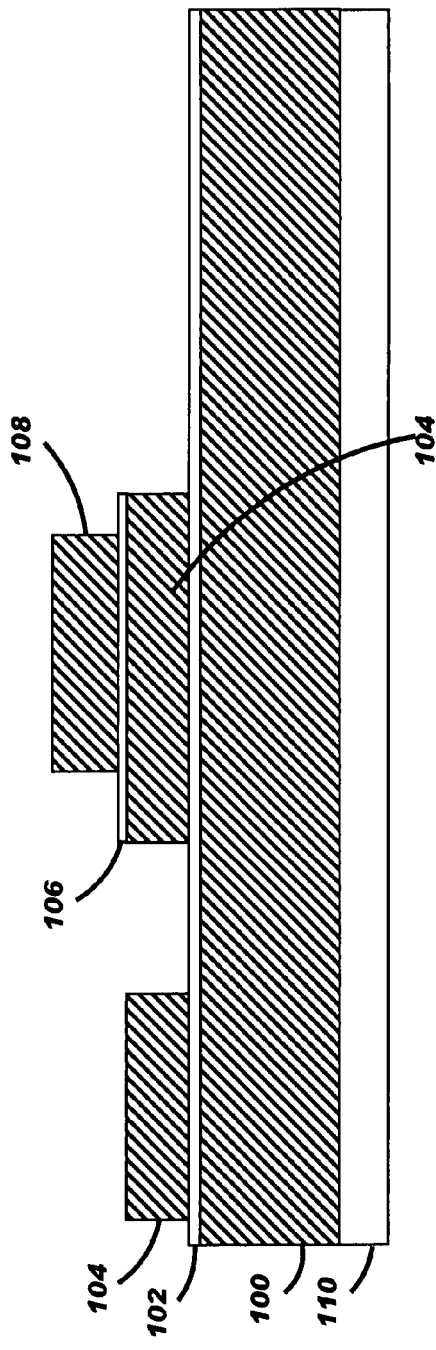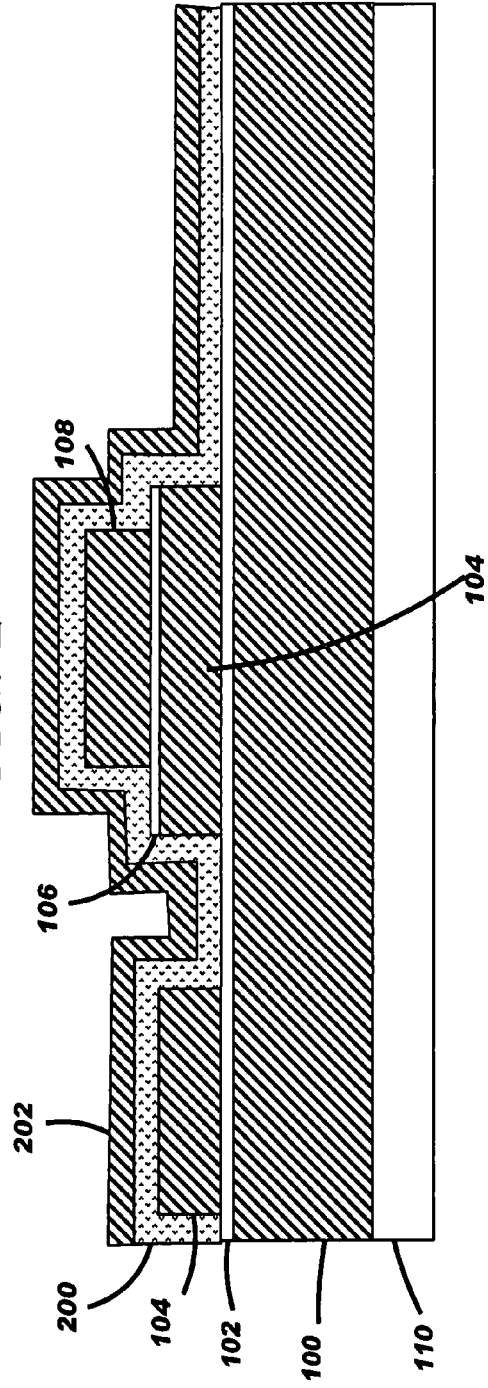

FIG. 7

Insulator 600

Residual Hardmask 200

No Erosion or Corner Rounding

700 Distinction Between Insulator 600 and Hardmask 200

165nm

Oxide

Nitride Etchstop

DARC

Top-plate

Middle-Plate

FORMATION OF METAL-INSULATOR-METAL CAPACITOR SIMULTANEOUSLY WITH ALUMINUM METAL WIRING LEVEL USING A HARDMASK

CROSS-REFERENCE TO RELATED APPLICATIONS

This application is a continuation of U.S. application Ser. No. 10/709,907 filed Jun. 4, 2004, now U.S. Pat. No. 7,301,752 which is fully incorporated herein by reference.

BACKGROUND OF THE INVENTION

1. Field of the Invention

The present invention generally relates to a method of fabricating a metal-insulator-metal (MIM) capacitor, where a hardmask is formed over the capacitor and a photoresist is patterned above the hardmask, which allows the capacitor and corresponding wiring layer to be simultaneously etched through the photoresist, without damaging the upper plate of the capacitor.

2. Description of the Related Art

Capacitors are widely used in integrated circuit technology. One type of well-known capacitor is the metal-insulator-metal capacitor (MIMCap). This type of capacitor has a lower conductive plate and an upper conductive plate separated by a dielectric. When manufacturing metal-insulator-metal capacitors, the dielectric and the upper plate are patterned on a conductive layer. A photoresist is then formed over the dielectric and upper plate in order to pattern the conductive layer into the lower conductive plate. However, the photoresist can sometimes be too thin at the corners of the upper plate, which causes the corners of the upper plate to be undesirably eroded (rounded) during the patterning of the underlying conductive layer.

In order to overcome this problem, a thicker photoresist could be used. However, as the photoresist becomes thicker, the spacing between structures (capacitors, adjacent wiring, etc.) that can be patterned by the thicker photoresist increases, which undesirably increases the pitch of the wiring. When there is an increase in the pitch of the lines (caused by the wider lines and spaces that result from the thicker resist), there is a decrease in wiring density of that level. This necessitates additional levels to compensate for loss in wirability, and makes the technology less attractive and more expensive.

Alternatively, this problem can be overcome by moving all MIMCaps to a level within the integrated circuit structure that already has a wider pitch. However, this is also unattractive because it necessitates that there be a wider pitch level for designs which have MIMCaps, which again adds cost and complexity.

The invention described below solves this problem without increasing the thickness of the photoresist, and in fact allows an even thinner photoresist to be utilized. Therefore, the invention overcomes the problem of upper plate corner rounding without increasing the pitch of the wiring.

SUMMARY OF THE INVENTION

The invention involves a method of fabricating a metal-insulator-metal (MIM) capacitor. In this method, a dielectric layer is formed above a lower conductor layer and an upper conductor layer is formed above the dielectric layer. The upper conductor layer is first patterned using a photolithographic process followed by an etching process. The invention then forms an etch stop layer above the upper conductor layer and the dielectric layer, and forms a hardmask (silicon oxide hardmask, a silicon nitride hardmask, etc.) over the etch stop layer. Next, a photoresist is patterned above the hardmask, which allows the hardmask, the etch stop layer, the dielectric layer, and the lower conductor layer to be etched through the photoresist.

This etching process simultaneously patterns lower capacitor plates and wiring patterns in the lower conductor layer. Further, the etching process can comprise a multi-step etching process where different etches are used to pattern one or more of the hardmask, the upper conductor, the dielectric layer, the etchstop, the lower conductor, etc. The hardmask protects the upper conductor layer from corner rounding during the etching process.

A patterned portion of the upper conductor layer comprises an upper plate of the capacitor, a patterned portion of the lower conductive layer below the upper plate comprises a lower plate of the capacitor, and a patterned portion of the dielectric layer between the upper plate and the lower plate comprises a capacitor dielectric.

The invention can also form dual MIM capacitors by forming a second dielectric layer above the upper conductor layer and patterning a third conductor layer above the upper conductor layer before the hardmask is formed.

This methodology produces a MIM capacitor that has a lower conductor layer that includes at least one lower capacitor plate and at least one wiring level. This structure also includes at least one capacitor dielectric above the capacitor plate and at least one upper capacitor plate above the capacitor dielectric. The invention can use an etch stop layer on the upper capacitor plate and a hardmask on the etch stop layer, or the etch stop layer can be omitted. The etch stop layer (or hardmask) is located along the top and sides of the upper capacitor plate.

The hardmask has a pattern matching an etched pattern within the lower conductor layer. The lower capacitor plate, the capacitor dielectric, and the upper capacitor plate form a metal-insulator-metal capacitor. The metal-insulator-metal capacitor can be a single metal-insulator-metal capacitor, or a dual metal-insulator-metal capacitor. The dual metal-insulator-metal capacitor would include a second capacitor dielectric and a second upper plate. In the final structure an insulator layer covers the hardmask; however, the hardmask is distinct from the insulator layer. The hardmask can be chemically distinct from the insulator layer or chemically similar, yet structurally different (being formed in a different process).

Further, because the invention uses a hardmask, a much thinner photoresist can be used to pattern the hardmask and underlying conductor layers. This allows the invention to form much smaller features than that could be formed with a thicker photoresist. For example, the invention allows the spacing between wires in the wiring pattern to be as small as approximately one-half the height of the upper capacitor plate.

Therefore, the invention uses a hardmask to simultaneously pattern the bottom plate of the MIMCap and wiring level and can use a thinner resist to pattern the dielectric hardmask to the desired fine pitch. The invention uses the residual resist from the hardmask patterning to pattern the underlying conductive layer because the hardmask provides better protection for MIMCap. Further, the invention integrates an etchstop with the hardmask to further reduce process complexity and cost. Thus, the invention simultaneously patterns large structures with significant topography and very fine pitch structures, which was not possible prior to the invention.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which:

FIG. 1 is a cross-sectional schematic diagram of a partially completed integrated circuit structure according to the invention;

FIG. 2 is a cross-sectional schematic diagram of a partially completed integrated circuit structure according to the invention;

FIG. 7 is a micrograph showing the distinction between the insulator layer and hardmask.

DETAILED DESCRIPTION OF PREFERRED EMBODIMENTS OF THE INVENTION

Figure 3:
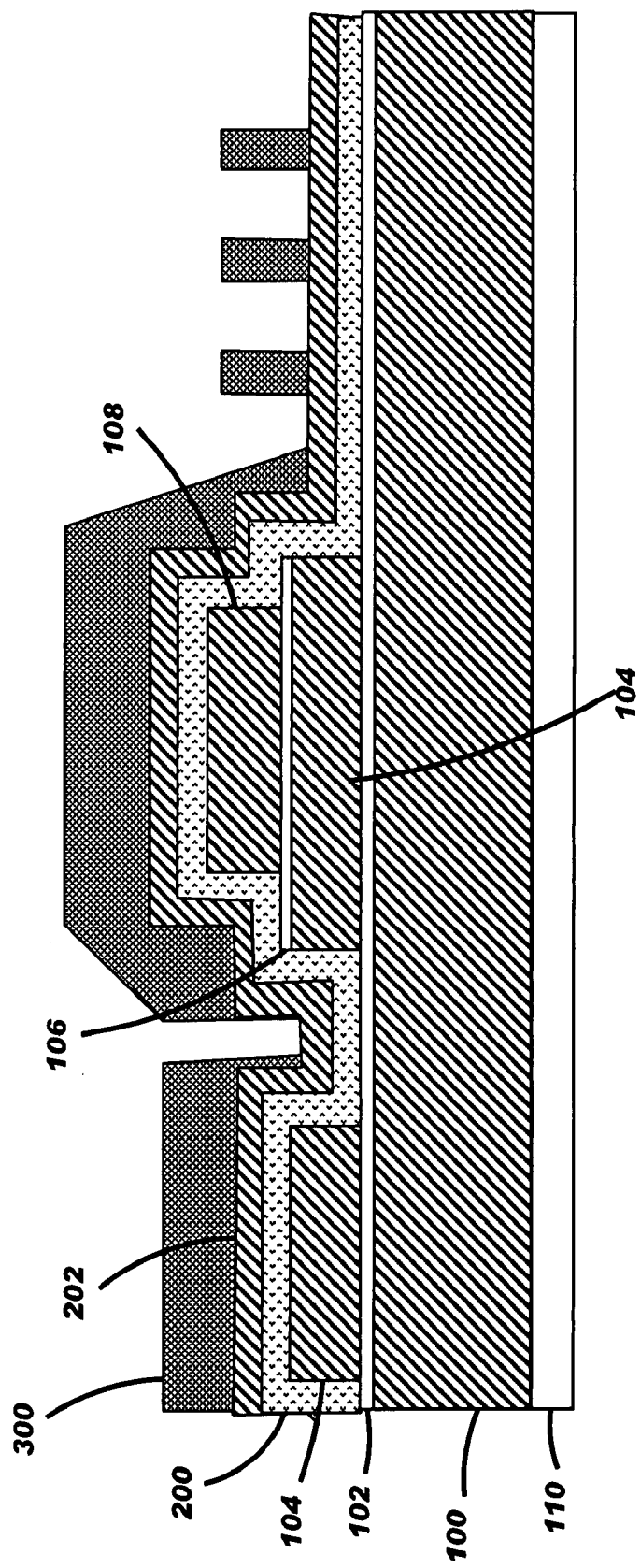
FIG. 3 is a cross-sectional schematic diagram of a partially completed integrated circuit structure according to the invention.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As mentioned above, a MIMCap type of capacitor has a lower conductive plate and an upper conductive plate separated by a dielectric. Dual MIMCap have the same lower conductive plate, dielectric, and upper conductive plate, and also include a second dielectric (above the upper conductive plate) and a second upper conductive plate above the second dielectric. Both such structures are illustrated in the following drawings.

As shown in FIG. 1, a dielectric layer 102 is formed above a lower conductor layer 100 and an upper conductor layer 104 is then patterned above the dielectric layer 102. Item 110 represents a substrate. Similarly, for areas where the dual metal-insulator-metal capacitor will be formed, a second dielectric 106 is patterned and a second upper conductor plate 108 is also patterned before the first upper conductor plate is patterned. The materials and processes used to form these structures are well-known to those ordinarily skilled in the art and a detailed discussion of the same is avoided to focus the reader on the salient features of the invention.

As shown in FIG. 2, the invention then optionally forms an etch stop layer 200 (such as a nitride, etc.) above the upper conductor layers 104, 108 and the dielectric layers 102, 106, and forms a hardmask 202 (silicon oxide hardmask, silicon nitride hardmask, etc.) over the etch stop layer 200 using any conventional deposition process such as thermal growth, chemical vapor deposition (CVD), plasma vapor deposition (PVD), etc. Next, as shown in FIG. 3, a photoresist 300 is patterned above the hardmask 202. As shown below, the hardmask 202, the etch stop layer 200, the dielectric layer 102, and the lower conductor layer 100 will be etched through the photoresist 300.

Figure 4:
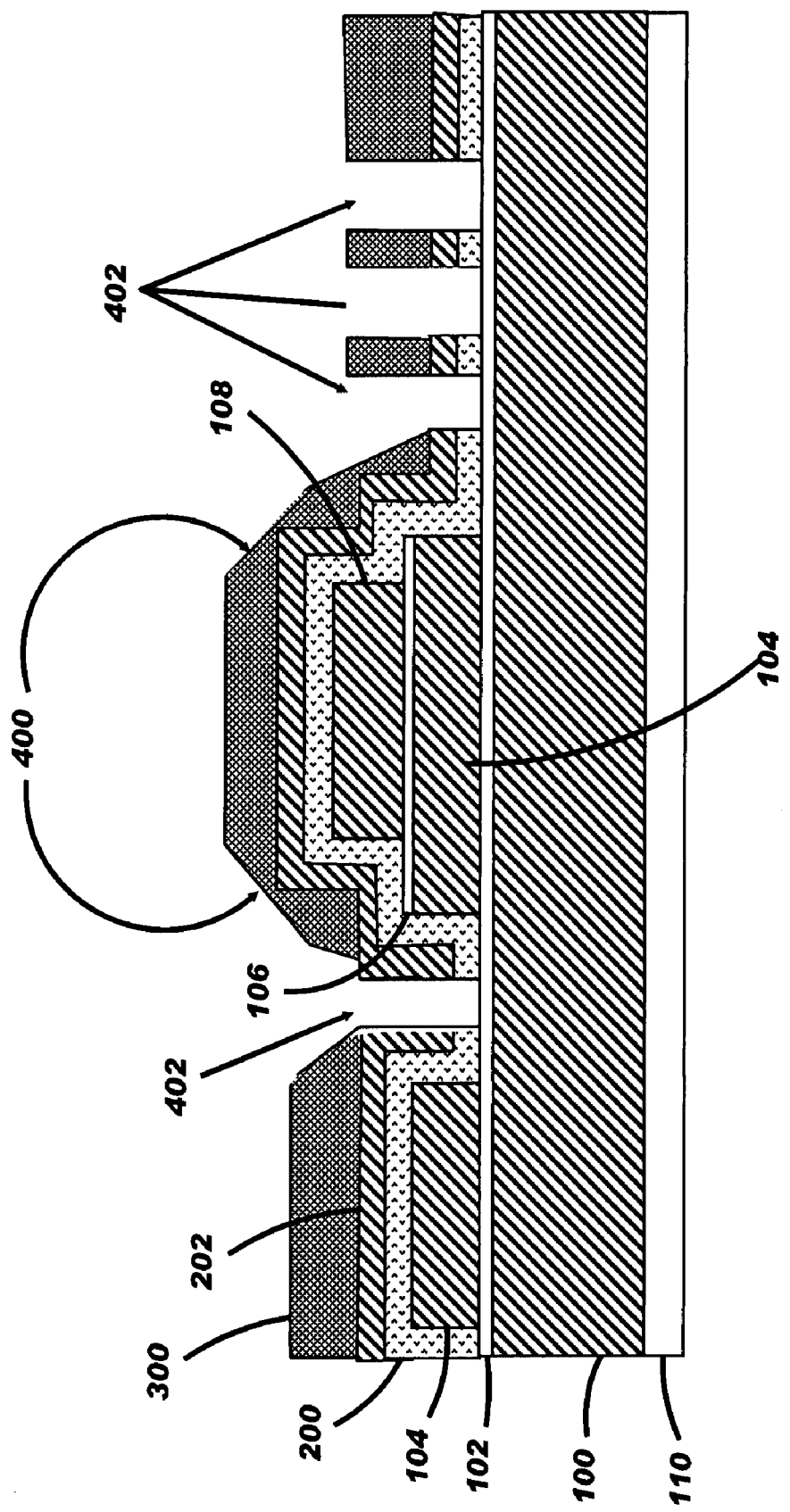
FIG. 4 is a cross-sectional schematic diagram of a partially completed integrated circuit structure according to the invention.

Any conventional etching process (such as selective reactive ion etching (RIE)) is then performed to remove portions of the hardmask 202 stopping partially on, or completely through, the etch stop layer 200, as shown in FIG. 4. This forms openings 402. This process causes some erosion of the photoresist 300 as shown by arrows 400 in FIG. 4. The hardmask 202 protects the upper conductor layer 104 from corner rounding during the etching process.

The etch selectivity of the hardmask 202, when compared to the photoresist 300, is higher than the etch selectivity of the conductor 104, 108 when compared to the photoresist 300 for typical hardmask etch processes. Therefore, a thinner photoresist 300 can be used with the hardmask 202 in place. Otherwise, because of the reduced etch selectivity, when etching the oxide 102 or conductor 100, a thicker photoresist 300 would be needed without the hardmask 300 because more of the photoresist 300 would be consumed in such an etching process. By using the hardmask 202, more of the hardmask 202 material is consumed and the less of the photoresist 300 is consumed, thereby allowing the photoresist 300 to be thinner. When a thinner photoresist is used, smaller openings can be patterned, which allows features to be spaced more closely, thereby decreasing the pitch of any wiring patterns.

This etching process can simultaneously pattern lower capacitor plates and wiring patterns in the lower conductor layer 100. The etching process can comprises a single or multi-step etching process where different etches are used to pattern the hardmask 202, the upper conductor, the dielectric layer 102, the etchstop 200, and/or the lower conductor 100, etc. In one example, residual resist from the hardmask opening procedure (HMO) in FIG. 4 is used to polymerize sidewalls during the subsequent metal etching (in FIG. 5) to provide directionality and a proper profile. The distinction of how many different etching processes are required varies depending upon the different materials that are used and upon the different types of etching processes that are used.

Figure 5:
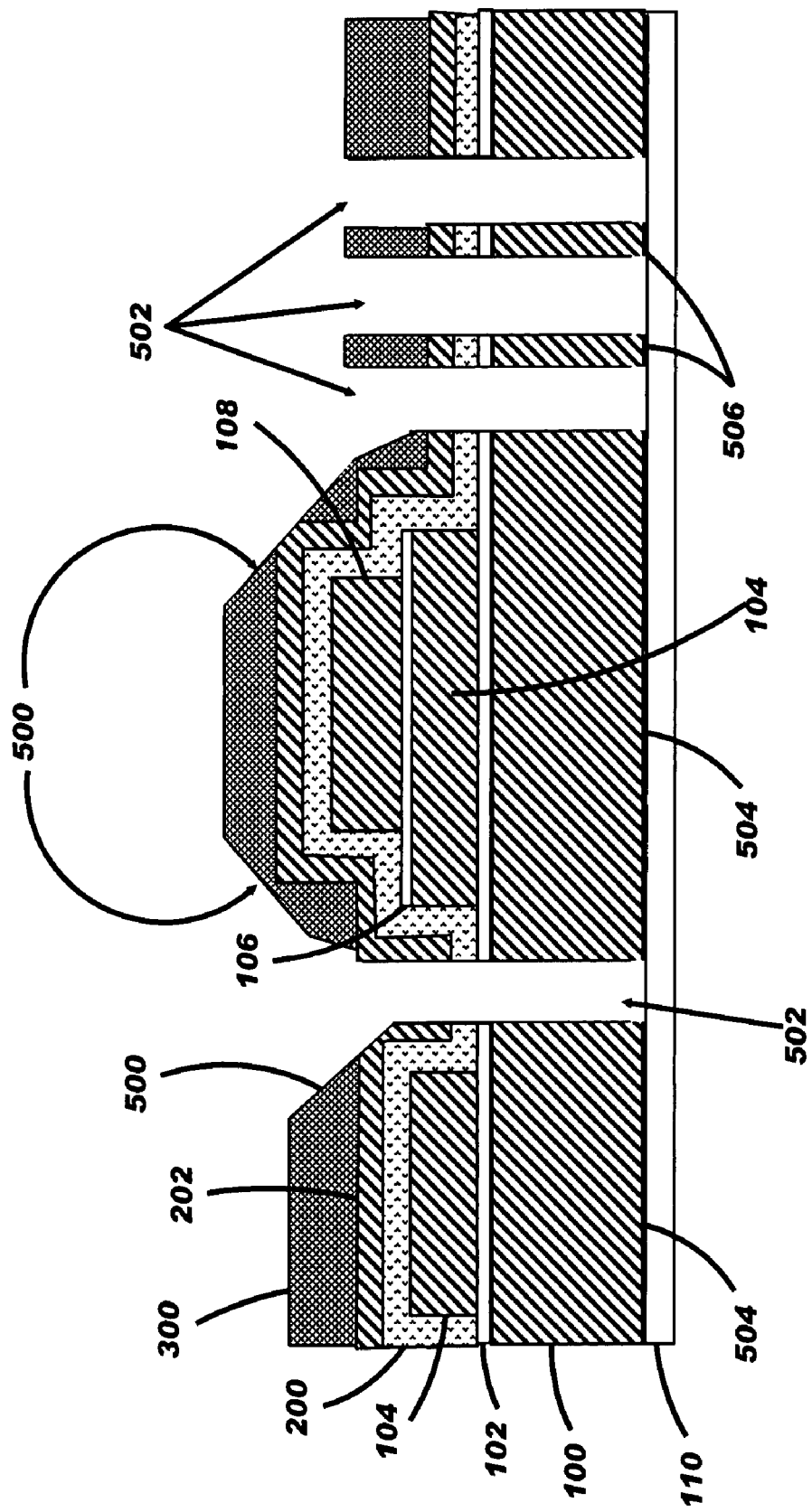
FIG. 5 is a cross-sectional schematic diagram of a partially completed integrated circuit structure according to the invention.

FIG. 5 illustrates the structure after etching has been completed through the lower conductor layer 100. These etching processes create openings 502. Note that the additional etching process further erodes the photoresist 300 as shown by arrows 500. This etching process may even remove some of the hardmask 202; however, the upper conductor plates 104, 108 are not affected by the etching process and do not suffer from the corner rounding problem that is discussed in the background section. This process simultaneously forms the lower conductor plates 504, as well as wiring patterns 506 from the lower conductor layer 100.

Figure 6:
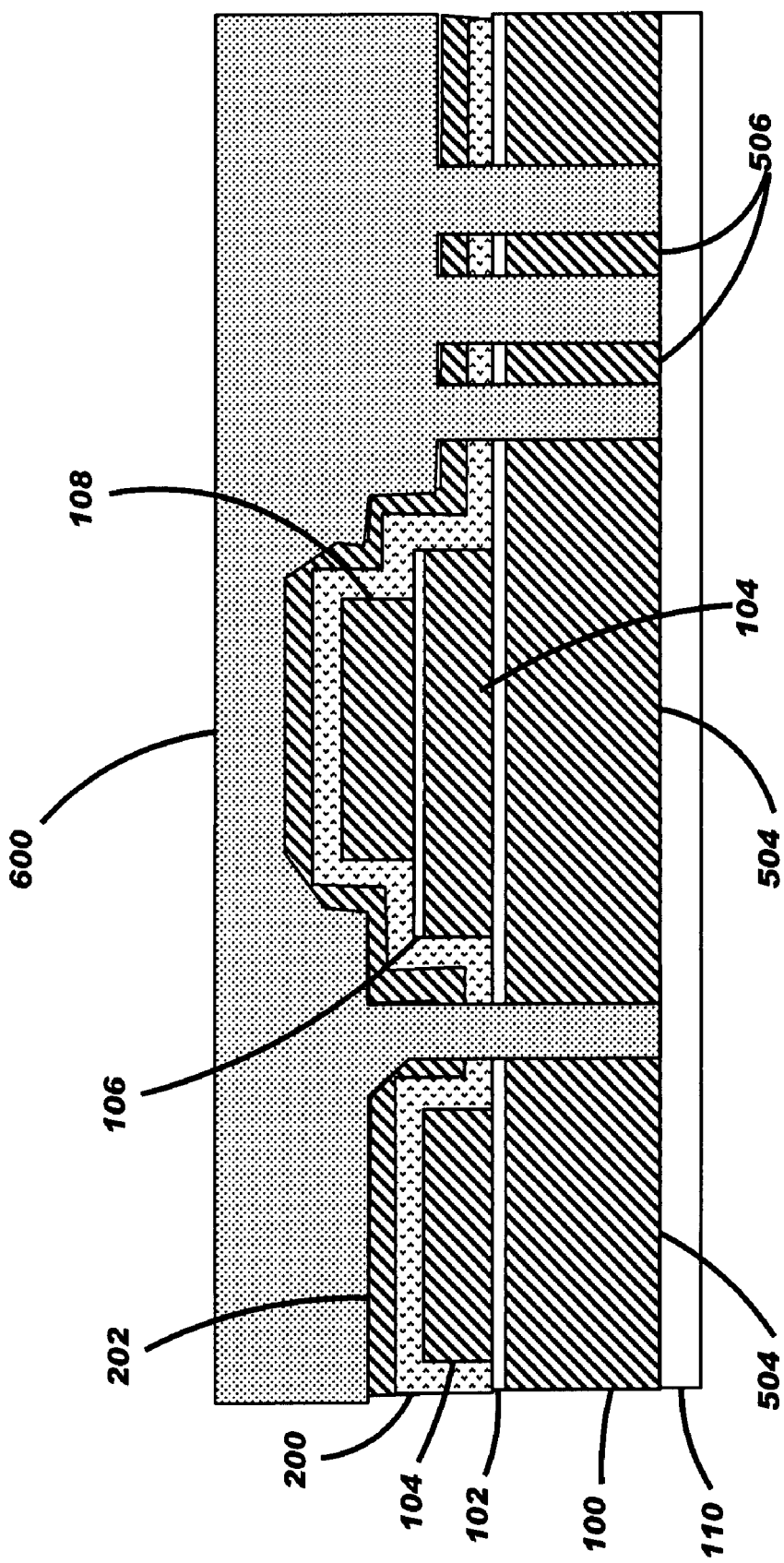
FIG. 6 is a cross-sectional schematic diagram of a partially completed integrated circuit structure according to the invention.

As shown in FIG. 6, the invention produces a MIM capacitor that has a lower conductor layer 100 that includes a least one lower capacitor plate 504 and at least one wiring pattern 506. This structure also includes at least one capacitor dielectric 102, 106 above the capacitor plates and at least one upper capacitor plate 104, 108 above the capacitor dielectric. The invention can use an etch stop layer 200 on the upper capacitor plate and a hardmask 202 on the etch stop layer 200, or the etch stop layer 200 can be omitted. The etch stop layer 200 or hardmask 202 is located along the top and sides of the upper capacitor plate.

The hardmask 202 has a pattern matching an etched pattern within the lower conductor layer 100. The lower capacitor plate 504, the capacitor dielectric 102, 106, and the upper capacitor plates 104, 108 can form either a single metal-insulator-metal capacitor, or a dual metal-insulator-metal capacitor. The dual metal-insulator-metal capacitor includes the second capacitor dielectric 106 and the second upper plate 108. In addition, the etch stop layer 200 remains in the structure.

In the final structure an insulator layer 600 (e.g., an inter-layer dielectric (ILD)) covers the hardmask 202; however, the hardmask 202 is distinct from the insulator layer 600. The hardmask 202 can be chemically distinct from the insulator layer 600 or chemically similar, yet structurally different (being formed in a different process). The distinction 700 between the insulator layer 600 and hardmask 202 can be seen in micrograph form in FIG. 7.

Figure 8:
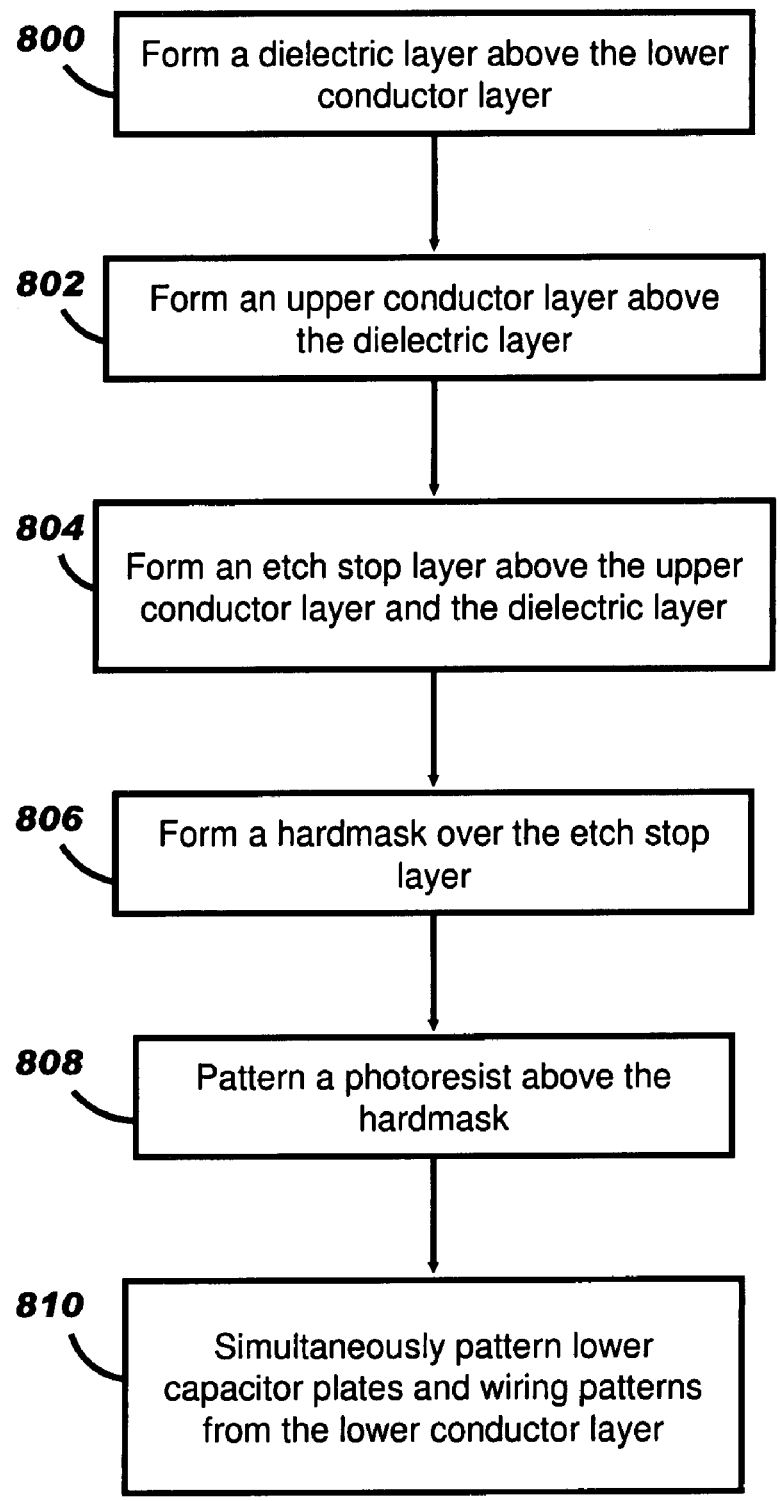
FIG. 8 is a flow diagram illustrating a preferred method of the invention.

The above processing is shown in flowchart form in FIG. 8. More specifically, in item 800, the invention begins by forming a dielectric layer above the lower conductor layer and, in item 802 an upper conductor layer is formed above the dielectric layer. The invention then forms an etch stop layer above the upper conductor layer and the dielectric layer (804), and forms a hardmask over the etch stop layer in item 806. Next, in item 808, a photoresist is patterned above the hardmask, which allows the hardmask, the etch stop layer, the dielectric layer, and the lower conductor layer to be etched through the photoresist.

This etching process simultaneously patterns lower capacitor plates and wiring patterns from the lower conductor layer 810. The etching process 810 can comprises a multi-step etching process where different etches are used to pattern one or more of the hardmask, the upper conductor, the dielectric layer, the etchstop, the lower conductor, etc. The hardmask protects the upper conductor layer from corner rounding during the etching process.

As explained above, because the invention uses a hardmask, a much thinner photoresist 300 can be used to pattern the hardmask and underlying conductor layers. This allows the invention to form much smaller features than could be formed with a thicker photoresist 300. For example, the invention allows the spacing between wires in the wiring pattern 506 to be as small as approximately one-third the height of the upper capacitor plate (above the bottom of the bottom plate).

Therefore, the invention uses a hardmask 202 to pattern the bottom plate of the MIMCap and wiring level and can use a thinner resist to pattern the dielectric hardmask 202 to the desired fine pitch. The invention uses the residual resist from the hardmask 202 patterning to pattern the underlying conductive layer because the hardmask 202 provides better protection for MIMCap. Further, the invention integrates an etch-stop with the hardmask 202 to further reduce process complexity and cost. Thus, the invention simultaneously patterns large structures with significant topography and very fine pitch structures, which was not possible prior to the invention.

While the invention has been described in terms of preferred embodiments, those skilled in the art will recognize that the invention can be practiced with modification within the spirit and scope of the appended claims.

What is claimed is:

1. A capacitor structure comprising:
   a substrate;
   a lower conductor layer on said substrate, wherein said lower conductor layer comprises a least one lower capacitor plate and at least one wiring pattern positioned laterally adjacent to said lower capacitor plate and wherein said lower capacitor plate and said wiring pattern are separated by an insulator layer;
   at least one capacitor dielectric above said lower capacitor plate;
   at least one upper capacitor plate above said capacitor dielectric;
   an etch stop layer on said upper capacitor plate; and
   a hardmask on said etch stop layer.

2. The structure in claim 1, wherein said lower capacitor plate is wider than said upper capacitor plate such that outer portions of said lower capacitor plate extend laterally beyond said upper capacitor plate and wherein said etch stop layer comprises a horizontal portion above the top said upper capacitor plate and vertical portions above said outer portions of said lower capacitor plate and extending along sides of said upper capacitor plate.

3. The structure in claim 1, wherein said hardmask has a pattern matching an etched pattern within said lower conductor layer.

4. The structure in claim 1, wherein said lower capacitor plate, said capacitor dielectric, and said upper capacitor plate comprise a single metal-insulator-metal capacitor.

5. The structure in claim 4, further comprising at least one dual metal-insulator-metal capacitor on said substrate adjacent to said single metal-insulator-metal capacitor.

6. The structure in claim 1, wherein said insulator layer further covers and is distinct from said hardmask.

7. A capacitor structure comprising:
   a substrate;
   a lower conductor layer on said substrate, wherein said lower conductor layer comprises a least one lower capacitor plate and at least one wiring pattern positioned laterally adjacent to said lower capacitor plate and wherein said lower capacitor plate and said wiring pattern are separated by an insulator layer;
   a capacitor dielectric above said lower capacitor plate;
   at least one upper capacitor plate above said capacitor dielectric;
   at least one second capacitor dielectric above said upper capacitor plate;
   at least one second upper capacitor plate above said second capacitor dielectric;
   an etch stop layer on said second upper capacitor plate; and
   a hardmask on said etch stop layer.

8. The structure in claim 7, wherein said lower capacitor plate is wider than said upper capacitor plate such that outer portions of said lower capacitor plate extend laterally beyond said upper capacitor plate and wherein said upper capacitor plate is wider than said second upper capacitor plate such that outer portions of said upper capacitor plate extend laterally beyond said second upper capacitor plate.

9. The structure in claim 7, wherein said etch stop layer comprises horizontal portions above the top of said second upper capacitor plate and above the top of said outer portions of said upper capacitor plate and wherein said etch stop layer further comprises vertical portions above said outer portions of said lower capacitor plate, extending along sides of said upper capacitor plate and further extending along sides of said second upper capacitor plate.

10. The structure in claim 7, wherein said hardmask has a pattern matching an etched pattern within said lower conductor layer.

11. The structure in claim 7, wherein said lower capacitor plate, said capacitor dielectric, said upper capacitor plate, said second capacitor dielectric and said second upper capacitor plate comprise a dual metal-insulator-metal capacitor.

12. The structure in claim 11, further comprising at least one single metal-insulator-metal capacitor on said substrate adjacent to said dual metal-insulator-metal capacitor.

13. The structure in claim 7, wherein said insulator layer further covers and is distinct from said hardmask.

* * * * *